(12) United States Patent
Delgadino et al.

(10) Patent No.: US 8,083,963 B2
(45) Date of Patent: Dec. 27, 2011

(54) REMOVAL OF PROCESS RESIDUES ON THE BACKSIDE OF A SUBSTRATE

(75) Inventors: Gerardo A. Delgadino, Santa Clara, CA (US); Indrajit Lahiri, Santa Clara, CA (US); Teh-Tien Su, Milpitas, CA (US); Sy-Yuan Brian Shieh, Palo Alto, CA (US); Ashok Sinha, Los Altos Hills, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1004 days.

(21) Appl. No.: 11/695,918

(22) Filed: Apr. 3, 2007

(65) Prior Publication Data

US 2008/0194111 A1 Aug. 14, 2008

Related U.S. Application Data

(60) Provisional application No. 60/888,946, filed on Feb. 8, 2007.

(51) Int. Cl.
*H01L 21/461* (2006.01)
*C23F 1/00* (2006.01)

(52) U.S. Cl. ........ 216/67; 134/1.2; 134/21; 134/32; 438/707; 438/716; 438/725

(58) Field of Classification Search .......... None
See application file for complete search history.

(56) References Cited

U.S. PATENT DOCUMENTS

| | | | |
|---|---|---|---|
| 3,923,567 A | 12/1975 | Lawrence | |
| 5,075,256 A | 12/1991 | Wang et al. | |
| 5,131,979 A | 7/1992 | Lawrence | |
| 5,429,711 A | 7/1995 | Watanabe et al. | |
| 5,700,179 A | 12/1997 | Hasegawa et al. | |
| 5,800,725 A | 9/1998 | Kato et al. | |
| 5,821,166 A | 10/1998 | Hajime et al. | |
| 5,920,764 A | 7/1999 | Hanson | |
| 5,942,445 A | 8/1999 | Kato et al. | |
| 5,951,374 A | 9/1999 | Kato et al. | |
| 6,248,667 B1 | 6/2001 | Kim et al. | |
| 6,276,997 B1 | 8/2001 | Li | |
| 6,284,628 B1 | 9/2001 | Kuwahara et al. | |

(Continued)

FOREIGN PATENT DOCUMENTS

EP 0 414 038 A 2/1991

(Continued)

OTHER PUBLICATIONS

U.S. Appl. No. 11/237,327, filed Sep. 27, 2005, Kim et al.

(Continued)

*Primary Examiner* — Allan Olsen
(74) *Attorney, Agent, or Firm* — Janah & Associates, P.C.; Ashok K Janah

(57) ABSTRACT

A substrate is processed in a process chamber comprising a substrate support having a receiving surface for receiving a substrate so that a front surface of the substrate is exposed within the chamber. An energized process gas is used to process the front surface of the substrate. A peripheral edge of the backside surface of the substrate is cleaned by raising the substrate above the receiving surface of the substrate support to a raised position, and exposing the backside surface of the substrate to an energized cleaning gas.

24 Claims, 5 Drawing Sheets

U.S. PATENT DOCUMENTS

| | | | |
|---|---|---|---|
| 6,358,839 B1 | 3/2002 | Li et al. | |
| 6,372,609 B1 | 4/2002 | Aga | |
| 6,387,809 B2 | 5/2002 | Toyama | |
| 6,406,923 B1 | 6/2002 | Inoue et al. | |
| 6,483,173 B2 | 11/2002 | Li et al. | |
| 6,562,700 B1 | 5/2003 | Gu et al. | |
| 6,596,095 B2* | 7/2003 | Ries et al. | 148/33.1 |
| 6,607,675 B1 | 8/2003 | Hshieh et al. | |
| 6,693,047 B1 | 2/2004 | Lu et al. | |
| 6,762,132 B1 | 7/2004 | Yates | |
| 6,781,086 B2 | 8/2004 | Choi | |
| 6,881,590 B2 | 4/2005 | Wu | |
| 6,924,862 B2* | 8/2005 | Sohn et al. | 349/139 |
| 6,933,239 B2 | 8/2005 | Ying et al. | |
| 6,991,739 B2 | 1/2006 | Kawaguchi et al. | |
| 7,276,447 B1* | 10/2007 | Delgadino et al. | 438/694 |
| 7,377,978 B2* | 5/2008 | Nishizawa | 117/88 |
| 7,399,713 B2* | 7/2008 | Aegerter et al. | 438/745 |
| 7,432,209 B2* | 10/2008 | Delgadino et al. | 438/709 |
| 2001/0037761 A1* | 11/2001 | Ries et al. | 117/200 |
| 2002/0139387 A1 | 10/2002 | Yates | |
| 2003/0045131 A1* | 3/2003 | Verbeke et al. | 438/795 |
| 2003/0064607 A1 | 4/2003 | Leu et al. | |
| 2003/0092264 A1* | 5/2003 | Kajita et al. | 438/689 |
| 2003/0104320 A1 | 6/2003 | Nguyen et al. | |
| 2003/0136668 A1* | 7/2003 | Kobata et al. | 204/242 |
| 2003/0141246 A1 | 7/2003 | Ogawa et al. | |
| 2004/0084412 A1 | 5/2004 | Waldfried et al. | |
| 2004/0137745 A1 | 7/2004 | Houghton et al. | |
| 2004/0137748 A1 | 7/2004 | Jain et al. | |
| 2005/0054122 A1* | 3/2005 | Celii et al. | 438/3 |
| 2006/0042651 A1 | 3/2006 | Verhaverbeke et al. | |
| 2006/0051967 A1 | 3/2006 | Chang et al. | |
| 2006/0128151 A1 | 6/2006 | Ryu | |
| 2006/0201413 A1* | 9/2006 | Nishizawa | 117/84 |
| 2006/0254717 A1 | 11/2006 | Kobayashi et al. | |
| 2006/0292707 A1 | 12/2006 | Goodner | |
| 2007/0068900 A1 | 3/2007 | Kim et al. | |
| 2007/0222131 A1* | 9/2007 | Fukumoto et al. | 269/21 |
| 2007/0224826 A1 | 9/2007 | Delgadino et al. | |
| 2008/0179287 A1 | 7/2008 | Collins et al. | |
| 2008/0190448 A1* | 8/2008 | Kim et al. | 134/1.1 |

FOREIGN PATENT DOCUMENTS

| | | |
|---|---|---|
| EP | 1 953 803 A | 8/2008 |
| JP | 2003-167358 | 6/2003 |
| JP | 2006-319043 | 11/2006 |
| KR | 4023114 A | 3/2004 |
| WO | WO 99/56310 | 11/1999 |
| WO | WO 2004/010494 A3 | 1/2004 |
| WO | WO 2007/038580 | 4/2007 |
| WO | WO-2007/111837 | 10/2007 |

OTHER PUBLICATIONS

Partial European Search Report (EPO) in EP Application No. 08151163.6-1235, completed Sep. 25, 2009 (The Hague, Netherlands).

* cited by examiner

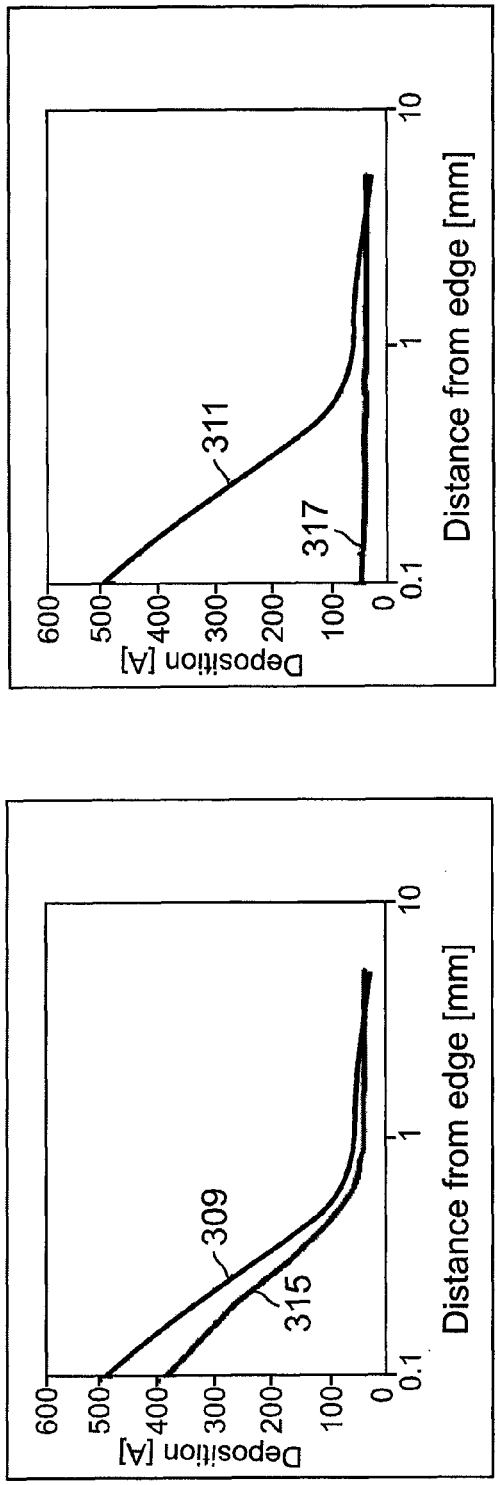
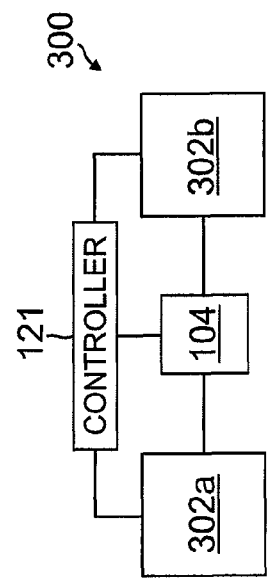
FIG. 5B
FIG. 5A
FIG. 6A

REMOVAL OF PROCESS RESIDUES ON THE BACKSIDE OF A SUBSTRATE

RELATED APPLICATION

This application is filed as a non-provisional application and claims priority from provisional application No. 60/888,946 which was filed on Feb. 8, 2007 and which is incorporated by reference herein in it's entirety.

BACKGROUND

Embodiments of the present invention relate to the ashing of resist and removal of process residues that form on a substrate.

In substrate fabrication processes, semiconductor, dielectric, and conductor materials are formed on a substrate and etched to form patterns of gates, vias, contact holes and interconnect features. These materials are typically formed by chemical vapor deposition (CVD), physical vapor deposition (PVD), oxidation and nitridation processes. For example, in CVD processes, a reactive gas is used to deposit a layer of material on the substrate, and in PVD processes, a target is sputtered to deposit material on the substrate. In oxidation and nitridation processes, a layer of oxide or nitride, typically silicon dioxide or silicon nitride, respectively, is formed by exposing the substrate to a suitable gaseous environment. In etching processes, a patterned etch-resistant mask of photoresist or hard mask is formed on the substrate by photolithographic methods, and the exposed portions of the substrate are etched by an energized gas.

As the size of circuit features being formed on the substrate continue to shrink and the feature geometry becomes more advanced, low-k dielectric materials are being increasingly used to cover the interconnect features. Low-k dielectric materials have a low dielectric constant "k" that is typically less than about 3. Examples of low-k dielectric materials include compositions of silicon, oxygen, carbon, and even hydrogen, such as for example, BLACK DIAMOND™, a dielectric formed by CVD. Low-k dielectric layers reduce the RC delay time in an integrated circuit allowing corresponding increases in density of the interconnect features.

However, when etching low-k dielectric materials, excessive amounts of process residues often form on the substrate because the process gas is designed to deposit sidewall polymer on the sidewalls of the features being etched into the low-k dielectric layer. For example, in dual damascene patterning, a low-k dielectric material to be etched relies on sidewall polymer deposition to achieve the desired selectivity to photoresist and barrier film. Polymer deposition is used to protect the photoresist and to minimize pinhole formations and striations on the substrate. However, this same polymer also deposits in undesired places such as the backside of the substrate as process residues, for example, when a substrate rests on and extends slightly beyond a substrate support. These residue deposits often flake off and contaminate the substrate and chamber environment.

Conventional process residue removal methods involve processing the substrate in an energized gas to remove the residues on the exposed front surface of the substrate. However, conventional residue removal methods often fail to suitably remove process residues from the backside surface of the substrate. Further, residue removal methods which are successful often end up damaging the low-k dielectric material on the substrate. Other techniques for cleaning the backside surface of the substrate, such as grinding, excessively scratch or otherwise damage the substrate surface. Conventional cleaning methods also often erode away an excessive amount of the underlying substrate during the cleaning process, which limits the number of times the substrate can be reclaimed for re-use. Accordingly, conventional cleaning techniques do not always provide satisfactory process residue removal.

Thus, it is desirable to remove the process residue deposits from the backside surface of a substrate. It is further desirable to remove such process residues without excessive damage to low-k dielectric material on the substrate.

DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

FIGS. 5A and 5B are graphical representations of the thickness of polymer on the backside surface of a substrate versus the distance of the polymer from the edge of the substrate, immediately after deposition and after sixty seconds of cleaning using oxidizing (5A) and reducing chemistry (5B);

FIG. 6A is a simplified diagram of a substrate processing apparatus having multiple chambers;

DESCRIPTION

Figure 1A:
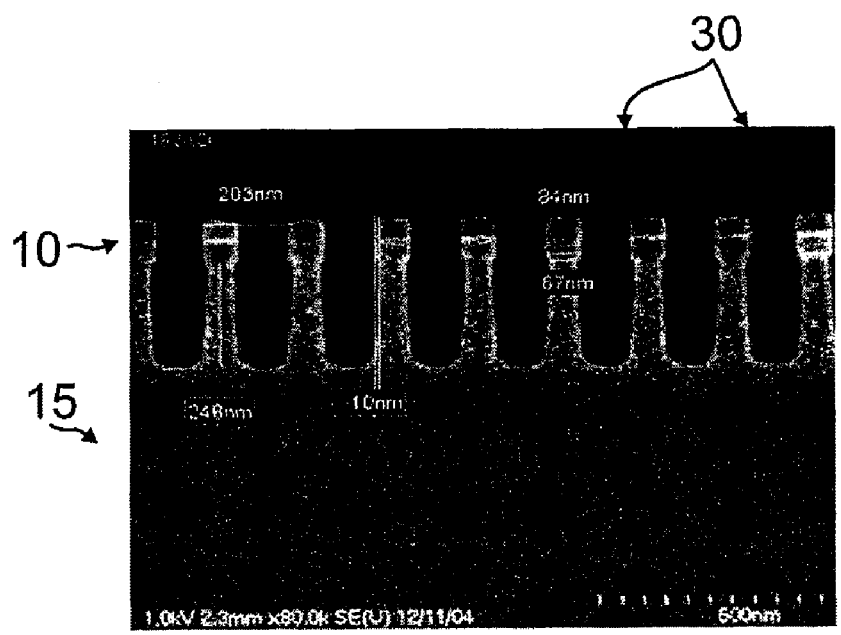
FIGS. 1A and 1B are each an SEM image of a substrate having a deposited polymer and etched trenches, that have been exposed to a cleaning gas comprising $H_2$ and $H_2O$.

An etching method is performed to etch through a resist layer 10 on a front surface 12 of a substrate 15 and clean the etch residue from the peripheral edge 18 of the backside surface 20 of the substrate 15. The peripheral edge 18 of the substrate 15 is defined as the zone within the first 3 millimeters radially inward of the edge of the substrate 15. The processing method cleans the peripheral edge 18 of the backside surface 20 of a substrate 15 to remove substantially all of the process residue and deposits on the peripheral edge 18 of the backside surface 20 of the substrate 15 without generating excessive sub-surface damage that could inhibit further use of the substrate 15, and without excessively etching or grinding away the material on the front surface 12 of the substrate 15. In one version, the substrate 15 comprises a photoresist layer 24 above a low-k dielectric layer 26.

To process the substrate 15, the substrate 15 is placed on the substrate receiving surface of a substrate support in the process zone of a process chamber by a substrate transfer mechanism through a slit valve in the process chamber. The substrate 15 may be secured to the receiving surface of the substrate support by application of electrostatic charge from an electrostatic chuck to the substrate 15. Optionally, the temperature of the substrate 15 can be controlled by use of gas lamps or a resistive heater in the support. Further, a heat transfer gas may be supplied below the substrate 15 in conduits of the substrate support to control the temperature of the substrate 15.

Process conditions in the process chamber are set to process the resist layer 10 on the front surface 12 of the substrate 15 while minimizing or avoiding damage to the underlying material of the substrate 15, for example, a low-k dielectric material. The process conditions comprise one or more of the process gas composition and volumetric flow rates, power levels of a gas energizer, gas pressure, and substrate temperature.

In an etching process, a process gas capable of etching a substrate 15 is energized to form a plasma. The plasma is maintained at process conditions suitable for etching the front surface 12 of the substrate 15 comprising the resist. Suitable process gases for etching layers on the substrate 15, include for example, $HCl$, $BCl_3$, $HBr$, $Br_2$, $Cl_2$, $CCl_4$, $SiCl_4$, $SF_6$, $F_2$, $NF_3$, $HF$, $CF_3$, $CF_4$, $CH_3F$, $CHF_3$, $C_2H_2F_2$, $C_2H_4F_6$, $C_2F_6$, $C_3F_8$, $C_4F_8$, $C_2HF_5$, $C_4F_{10}$, $CF_2Cl_2$, $CFCl_3$, $O_2$, $N_2$, $He$, $CO$, $C_4F_6$, $C_5F_8$, $Ar$, $Xe$, $CH_4$, $H_2$, $CO_2$ and mixtures thereof. For example, a low-k dielectric layer on the substrate 15 can be etched by any of: $C_4F_6$, $N_2$, $Ar$, $CH_2F_2$, $CF_4$, $CHF_3$, $C_4F_8$, $CH_3F$, $O_2$, $CO$ and $H_2$ and by mixtures thereof. In one version, the front surface 12 of a substrate 15 comprising a photoresist layer 24 above a low-k dielectric layer 26, is etched by exposing the front surface 12 of the substrate 15 to an energized process gas comprising $O_2$, $CO$, $CF_4$, $CO_2$, $NH_3$, $N_2$, $H_2$ and $H_2O$ to etch the photoresist layer 24.

After etching of the front surface 12 of the substrate 15, namely the resist layer 10, a cleaning process is performed to substantially remove the deposits of residue and polymer deposited on the peripheral edge 18 of the backside surface 20 of a processed substrate 15. The cleaning process desirably removes substantially all the etch residue deposited on the backside surface 20 of the substrate 15 without excessively eroding or otherwise damaging the underlying substrate 15, including the front surface 12 of the substrate 15.

In the cleaning process, the substrate 15 is lifted off from the receiving surface of the support by activation of a lift pin assembly within the support. To raise the substrate 15 off of the support, the lift pins are moved so that the lift pins extend through conduits in the support to contact the backside surface of the substrate 15 to lift the substrate off the receiving surface of the support to a height or distance d above the substrate support. The distance d that the substrate 15 is raised above the substrate receiving surface of the substrate support is selected in relation to the pressure of energized cleaning gas present in the process chamber. In one version, the substrate 15 is raised above the receiving surface of the substrate support by a distance d that is at least about 1 mm. If the lift pins are not raised high enough, then the plasma can form arcing and glow discharges between the substrate backside and the support surface due to the concentrated electrical field. Thus, in one version, the lift pins are raised to lift the substrate 15 above the substrate support by a distance of from about 1 to about 5 millimeters.

While the substrate 15 is maintained in a raised position above the receiving surface of the substrate support, a cleaning gas is introduced into the chamber. The composition of the cleaning gas is dependent upon factors such as etch by-product polymer type and is adjusted accordingly. The cleaning gas comprises a gas composition suitable for removing the polymer deposits on the backside of the substrate when energized by RF or microwave energy. In one version, the cleaning gas comprises $H_2$ and $H_2O$. This gas composition removes the backside polymer deposits because the hydrogen can protect film on the front side, and the water vapor serves to clean back side polymer. However other gases can also be used, including $NH_3$, $N_2$, $CO$, $CO_2$, which are typically formed using $N_2$ and $H_2$ gas sources. The flow rate of the gas introduced into the chamber comprises typically from about 50 to about 500 sccm of hydrogen, and from about 50 to about 4000 sccm of water vapor.

The cleaning gas is energized by RF energy applied to the gas by a gas energizer. The gas energizer can be operated by capacitively or inductively coupling energy to the cleaning gas. In one version, the gas energizer is operated by applying RF energy at a power level of from about 5000 to about 6000 Watts to the gas to create a plasma. In the cleaning chamber, the cleaning gas is energized by electrodes.

While the substrate 15 is maintained in the raised position a distance d above the receiving surface of the substrate support and with the cleaning gas pressure in the chamber maintained at about 1 Torr, the energized cleaning gas is exposed to the backside surface of the substrate to clean the peripheral edge 18 of the backside surface 20 of the substrate 15. The length of time the substrate 15 is exposed to the energized cleaning gas is generally dependent on the thickness of the deposits. In one version, the backside surface 20 of the substrate 15 is exposed to a cleaning gas for from about 30 to about 180 seconds. This exposure time is suitable for cleaning residue on the backside of the substrate 15 without damaging the processed front surface of the substrate 15 because if the substrate 15 is exposed to the energized cleaning gas for less than 30 seconds, there is not enough exposure time to the substrate for the energized cleaning gas to effectively remove deposited polymers and residues from the backside peripheral edge 18 of the substrate 15. However, over exposure to even this gas can result in potential damage to the front and/or backside of the substrate 15. In one version, the backside surface 20 of the substrate 15 is exposed to a cleaning gas for from about 30 to about 60 seconds. After the requisite time for exposing the backside surface of the substrate to the energized cleaning gas, the spent process gas is exhausted by a gas exhaust system.

Figure 1B:
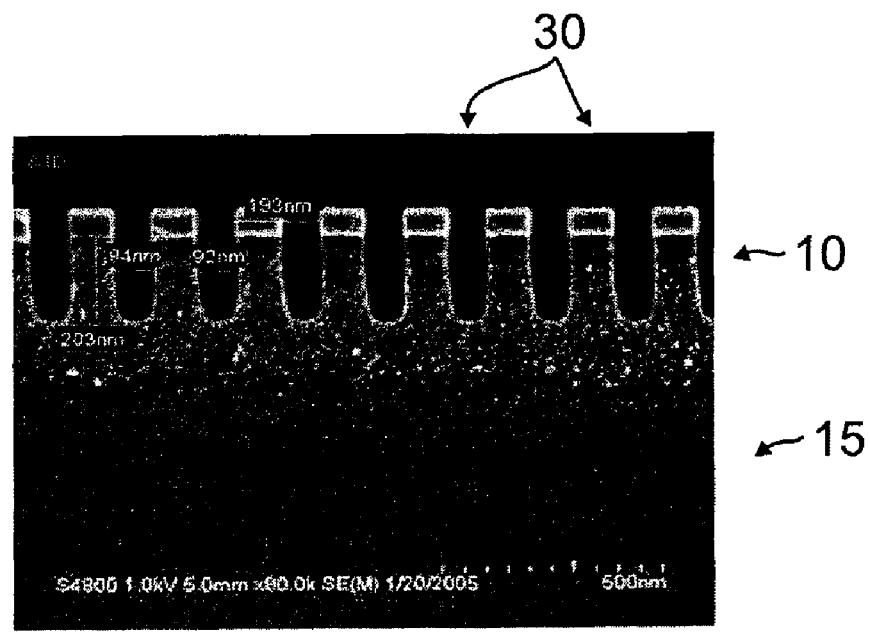

The effectiveness of the reducing chemistry used in the cleaning methods described above is illustrated in FIGS. 1A and 1B. In each case, a heavy polymer was deposited onto a substrate 15 using process gas comprising $C_4F_6$, $N_2$ and Ar. Approximately 400 angstroms of fluorocarbon polymer deposited on the backside surface 20 of the substrate 15 at about 0.1 mm from the peripheral edge 18 of the substrate 15. As can be seen in FIGS. 1A and 1B, each substrate 15 has been cleaned using a cleaning gas comprising $H_2$ and $H_2O$, with minimal damage to the sidewalls of the low k material trenches 30.

In one version, a substrate 15 comprising a photoresist layer 24 above a low-k dielectric layer 26 is placed on the receiving surface of a substrate support in a process chamber and lifted above the receiving surface of the support to a raised position to be exposed to an energized process gas to etch the substrate 15, while simultaneously being ashed to clean etch residue from a peripheral edge 18 of the backside surface 20 of the substrate 15.

Upon completion of the etching and cleaning processes, a substrate transfer mechanism comprising, for example, a robotic transport, is inserted between the substrate 15 and the receiving surface of the substrate support to lift the substrate 15 off the lift pins. Thereafter, the lift pins are retracted into the substrate support, and the robotic arm transports the substrate 15 out of the chamber and into a transfer chamber maintained in a vacuum environment.

Figure 2:
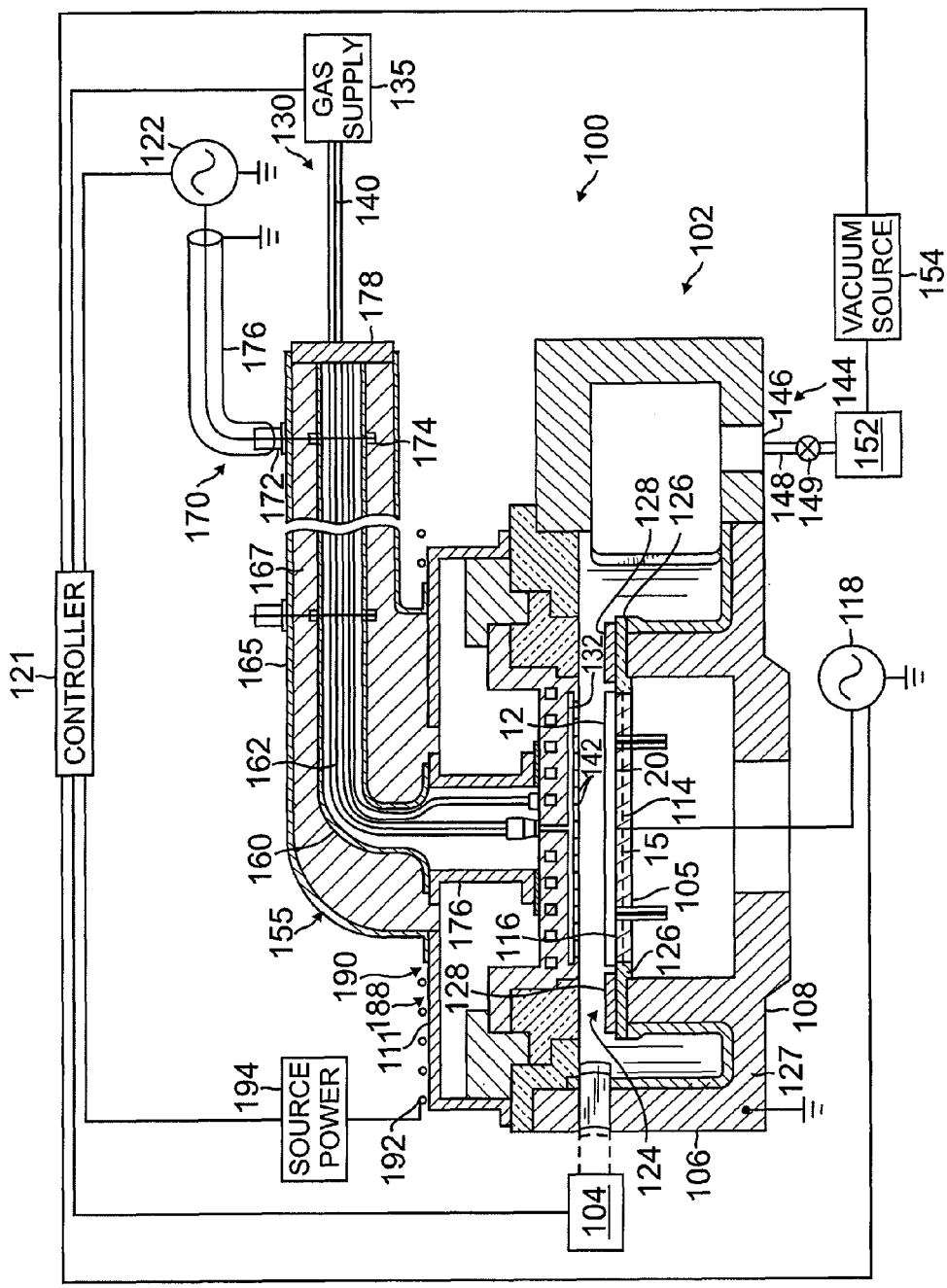
FIG. 2 is a partial sectional side view of an embodiment of a substrate processing apparatus.

An apparatus suitable for processing a substrate 15 according to the methods discussed above will now be described. An embodiment of an etch chamber capable of etching a resist layer 10 above a low-k dielectric material on a substrate 15 is shown, for example, in FIG. 2. FIG. 2 provides a cross-sectional view of a substrate processing apparatus 100 known as the Enabler™ etch system, available from Applied Materials, Inc., Santa Clara, Calif., and as disclosed in U.S. Pat. No. 6,528,751 issued to Daniel Hoffman et al., the disclosure of which is incorporated in its entirety herein by reference. The substrate processing chamber 102 of the apparatus 100 is mounted on a platform (not shown) that provides electrical, plumbing, and other support functions. The platform typically supports a load lock chamber and a substrate transfer chamber. The substrate transfer chamber contains a substrate transfer mechanism 104 such as a robot comprising a substrate blade, to transfer substrates 15 to and from the different chambers on the platform, for processing.

The substrate processing apparatus 100 comprises a processing chamber 102 comprising enclosure walls that include sidewalls 106, a bottom 108, and a ceiling 111 disposed thereon; the enclosure walls forming an isolated processing environment. The sidewalls 106 of the chamber 102 may be isolated from the processing environment in the chamber 102 by using magnetic isolation. Alternatively, the sidewalls 102 may have a dielectric coating thereon, or an annular dielectric insert or removable liner may be disposed adjacent the sidewalls 102. Ceiling 111 comprises a flat surface.

Chamber 102 further comprises a substrate support 105 to support a substrate 15 in the chamber 102. The substrate support 105 is generally formed from materials such as stainless steel, aluminum, or other materials that are electrically conductive and adapted to withstand substrate processing. The substrate support 105 typically comprises an electrostatic chuck comprising a dielectric body that at least partially covers an electrode 114 and which includes a substrate receiving surface 116. The electrode 114 may also serve as a process electrode. The electrode 114 may be capable of generating an electrostatic charge for electrostatically holding the substrate 15 to the electrostatic chuck. For example, the electrode 114 may be made, for example, from a metal such as tungsten, tantalum or molybdenum. A chucking voltage supply applies a DC chucking voltage to the electrode 114. To electrically bias plasma toward and away from the substrate support 105, a first electrical bias source 118 and second electrical bias source 122 may be coupled to the electrode 114.

Figure 3A:
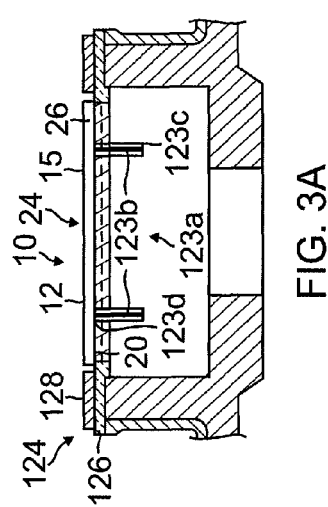
FIGS. 3A and 3B are partial sectional side views of a lift pin assembly in the substrate support showing the lift pins in a resting position (3A) and in a raised position (3B)
Figure 3B:
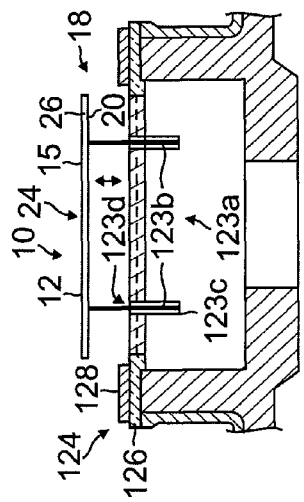

The substrate support 105 further comprises a lift pin assembly 123a. Referring to FIGS. 3A and 3B, the lift pin assembly 123a comprises a plurality of lift pins 123b suitable for raising the substrate 15 above the receiving surface 116 of the substrate support 105 to a raised position (FIG. 3B). Generally, the lift pins 123b comprise movable elongated members having tips suitable for lifting and lowering the substrate 15 off the receiving surface 116 of the substrate support 105 or electrostatic chuck by contact with the backside surface 20 of the substrate 15. The electrically conductive upper portion and lower portion of the lift pins 123b are made from metals or other rigid conductive materials having low resistance to current flow. The upper portion can also comprise a layer of a flexible material that prevents damage to the substrate 15 when the lift pins 123b are pushed upwardly against the substrate 15. The lift pins 123b pass through conduits 123c extending through the substrate support 105. The lift pins 105 can extend and retract through lift pin holes 123d at the top of the conduits 123c at the receiving surface 116 of the substrate support 105. The motion of the lift pins 123b to raise the substrate 15 in an upward direction above the substrate receiving surface 116 of the substrate support 105 and lower the substrate 15 back down to the receiving surface 116 of the substrate support 105 is controlled by a controller 121.

A ring assembly 124 may surround an outer edge of the substrate support 105. The ring assembly 124 comprises a deposition ring 126 made of a dielectric such as quartz, and a cover ring 128. The deposition ring 126 is supported on the grounded chamber body 127 and the cover ring 128 is supported by the deposition ring 126.

In operation, process gas is introduced into the chamber 102 through a gas delivery system 130 that includes a gas distributor 132, a process gas supply 135 comprising gas sources with respective conduits each having a gas control valve, such as a mass flow controller, to pass a set flow rate of the respective gas therethrough. The conduits feed the gases to a mixing manifold in which the gases are mixed to form a desired process gas composition. The mixing manifold passes the mixed process gas through a metal gas line 140 to the gas distributor 132 having gas outlets 142 in the chamber 102.

Spent process gas and byproducts are exhausted from the chamber 102 through a gas exhaust 144. The exhaust 144 includes one or more exhaust ports 146 that receive spent process gas and pass the spent gas to an exhaust conduit 148 in which there is a throttle valve 149 to control the pressure of the gas in the chamber 102. The exhaust conduit 148 feeds one or more exhaust pumps 152. The exhaust pump 152 is in fluid communication with a vacuum source 154 through a pumping valve (not shown). It is contemplated that the exhaust pump 152 may be a separate body coupled to the chamber 102 (as shown). In a gas purge or vacuum process, the pumping valve couples the vacuum source to the port 146 at a pressure desired for semiconductor processing while allowing for rapid removal of waste gases using a single vacuum source 154.

A coaxial stub 155 is attached to and in fluid connection with the ceiling 111 of the chamber 102. The stub 155 includes an inner cylindrical conductor 160 and an outer concentric cylindrical conductor 165. An insulator 167, preferably having a relative dielectric constant of 1, fills the space between the inner and outer conductors 160, 165. The inner and outer conductors 160, 165 are formed of nickel-coated aluminum. The stub 155 characteristic impedance is determined by the radii of the inner and outer conductors 160, 165 and the dielectric constant of the insulator 167. Generally, the stub 155 characteristic impedance exceeds the source power output impedance by about 20%-40% and preferably by about 30%. The stub 155 has an axial length of about 29 inches and a quarter wavelength at about 220 MHz, in order to have a resonance in the vicinity of 220 MHz to generally match while being slightly offset from the preferred VHF source power frequency of 210 MHz.

A tap 170 is provided at a particular point along the axial length of the stub 155 for applying RF power from the RF generator 122 to the stub 155. The RF power terminal 172 and the RF return terminal 174 of the generator 122 are connected at the tap 170 on the stub 155, to the inner and outer coaxial stub conductors 160, 165, respectively. These connections are made via a generator-to-stub coaxial cable 176 having a characteristic impedance that matches the output impedance of the generator 122, which is typically about 50Ω. A terminating conductor 178 at the far end of the stub 155 shorts the inner and outer conductors 160, 165 together, so that the stub 155 is shorted at its far end.

The process gas is energized to process the substrate 15 by a gas energizer 188 that couples energy to the process gas in the chamber 102. The gas energizer 188 comprises an antenna 190 adjacent to the ceiling 111. The antenna 190 may be configured with RF coils 192 coupled to a source RF power generator 194 through a matching network (not shown), to inductively couple RF energy into the chamber 102.

The apparatus may further comprise a process monitor adapted to monitor a process being conducted in the chamber. The process monitor may be an interferometer or a plasma emission analyzer.

The chamber 102 is operated by a controller 121 comprising a computer that sends instructions via a hardware interface to operate the chamber components, including the substrate support 105 to raise and lower the substrate support 15, the lift pin assembly 123a to raise and lower the substrate 15 from the substrate receiving surface 116 of the substrate support 105 by lift pins 123b, the gas flow control valves of the gas distributor 132, the gas energizer 188, and the throttle valve of the gas exhaust system 144. The process conditions and parameters measured by the different detectors in the chamber 102, are sent as feedback signals by control devices such as the gas flow control valves, pressure monitor, throttle valve, and other such devices, are transmitted as electrical signals to the controller 121. Although the controller 121 is illustrated by way of an exemplary single controller device to simplify the description of present invention, it should be understood that the controller 121 may be a plurality of controller devices that may be connected to one another or a plurality of controller devices that may be connected to different components of the chamber 102—thus, the present invention should not be limited to the illustrative and exemplary embodiments described herein.

The controller 121 comprises electronic hardware including electrical circuitry comprising integrated circuits suitable for operating the chamber and its peripheral components. Generally, the controller 121 is adapted to accept data input, run algorithms, produce useful output signals, detect data signals from the detectors and other chamber components, and to monitor or control the process conditions in the chamber. For example, the controller 121 may comprise a computer comprising (i) a central processing unit (CPU), such as for example a conventional microprocessor from INTEL Corp., that is coupled to a memory that includes a removable storage medium, such as for example a CD or floppy drive, a non-removable storage medium, such as for example a hard drive or ROM, and RAM; (ii) application specific integrated circuits (ASICs) that are designed and preprogrammed for particular tasks, such as retrieval of data and other information from the chamber, or operation of particular chamber components; and (iii) interface boards that are used in specific signal processing tasks, comprising, for example, analog and digital input and output boards, communication interface boards, and motor controller boards. The controller interface boards, may for example, process a signal from a process monitor and provide a data signal to the CPU. The computer also has support circuitry that include for example, co-processors, clock circuits, cache, power supplies and other well known components that are in communication with the CPU. The RAM can be used to store the software implementation of the present invention during process implementation. The one or more lines of code which comprise various instructions of the present invention are typically stored in storage mediums, and are recalled for temporary storage in RAM when being executed by the CPU. The user interface between an operator and the controller 121 can be, for example, via a display and a data input device 204, such as a keyboard or light pen. To select a particular screen or function, the operator enters the selection using the data input device and can review the selection on the display.

The controller 212 comprises a computer program 206 that is readable by the computer and may be stored in the memory, for example on the non-removable storage medium or on the removable storage medium. The computer program 206 generally comprises process control software comprising program code comprising instructions to operate the chamber 102 and its components, process monitoring software to monitor the processes being performed in the chamber 102, safety systems software, and other control software. The computer program 206 may be written in any conventional programming language, such as for example, assembly language, C++, Pascal, or Fortran. Suitable program code is entered into a single file, or multiple files, using a conventional text editor and stored or embodied in computer-usable medium of the memory. If the entered code text is in a high level language, the code is compiled, and the resultant compiler code is then linked with an object code of pre-compiled library routines. To execute the linked, compiled object code, the user invokes the object code, causing the CPU to read and execute the code to perform the tasks identified in the program.

Figure 4:
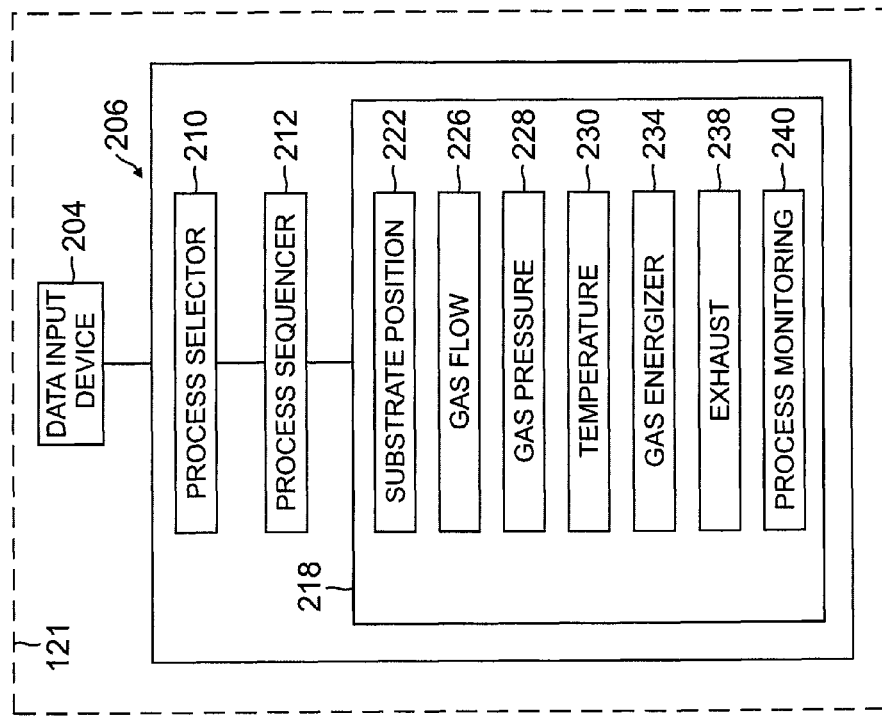
FIG. 4 is an illustrative block diagram of a hierarchical control structure of an embodiment of a computer program suitable for operating the chambers.

An illustrative block diagram of a hierarchical control structure of a specific embodiment of a computer program 206 according to the present invention is shown in FIG. 4. Using the data input device 204, for example, a user enters a process set into the computer program 206 in response to menus or screens on the display that are generated by a process selector 210. The computer program 206 includes instruction sets to control the substrate position, gas flow, gas pressure, temperature, RF power levels, and other parameters of a particular process, as well as instructions sets to monitor the chamber process.

A process sequencer 212 comprises instruction sets to accept a set of process parameters from the computer program 206 or the process selector 210 and to control its operation. The process sequencer 212 initiates execution of the process set by passing the particular process parameters to a chamber manager 218 that controls multiple tasks in the chamber 102. The chamber manager 218 may include instruction sets, such as for example, substrate positioning instruction sets 222, gas flow control instruction sets 226, gas pressure control instruction sets 228, temperature control instruction sets 230, gas energizer control instruction sets 234, and process monitoring instruction sets 240.

The substrate positioning instruction sets 222 comprise program code for controlling chamber components that are used to load and unload a substrate 15 from the support 105. The instruction sets 222 further comprise code to operate the substrate support to lift and lower the support 105 to a desired height in the chamber 102. The instruction sets 222 comprise code to operate the lift pin assembly 123a to lift and lower a substrate 15 from the receiving surface 116 of the substrate support 105 to a raised position a distance or height d above the receiving surface 16 of the substrate support 105 as well as lower the substrate 15 back down to contact or rest upon the substrate receiving surface 116 of the support 105. In one embodiment, the controller 121 comprises program code that comprises instructions to operate the lift pins 123b to raise the substrate 15 above the receiving surface 116 of the substrate support 105 to a raised position and while maintaining the substrate 15 in the raised position, operating the gas distributor 132, gas energizer 188, and gas exhaust 238, to expose the substrate 15 to an energized cleaning gas to clean a peripheral edge 18 of the backside surface 20 of the substrate 15. In one embodiment, the controller 121 comprises program code that comprises instructions to operate the lift pins 123b to raise the substrate 15 above the receiving surface 116 of the substrate support 105 by a distance d selected in relation to a pressure of the energized cleaning gas in the process chamber 102. In one version, the program code comprises instructions to operate the lift pins 123b to lift the substrate 15 above the substrate receiving surface 116 of the substrate support 105 by a distance of from 1 to 5 mm.

The gas flow control instruction sets 226 comprises code for controlling the flow rates of different constituents of the process gas by regulating the opening size of the gas flow control valves to obtain the desired gas flow rates from the gas outlets 142 into the chamber 102. The gas energizer control instruction sets 188 comprise code for setting, for example, the RF power level applied to the electrode 114. In one embodiment, the controller 121 comprises program code to comprising instructions to operate the gas distributor 132 and gas energizer 188 to expose the substrate 15 to an energized cleaning gas comprising $H_2$ and $H_2O$. In one version, the program code comprises gas flow and pressure instruction sets 226, 228 to operate the gas distributor 132 to pass gas comprising 7000 sccm of $H_2$ and 90 sccm of $H_2O$ at a vapor line temperature of 100° C. to the backside of the substrate 15 while the substrate 15 is lifted above the substrate receiving surface 116 of the support 105 by the lifts pins 123b. No energy is applied to the gas. In one version, the program code comprises instructions to operate the gas distributor 132 and gas energizer 188 to expose the substrate 15 to an energized cleaning gas for from about 30 to about 180 seconds. In one version, the program code comprises instructions to operate the gas distributor 132 and gas energizer 188 to expose the substrate 15 to an energized cleaning gas for from about 30 to about 60 seconds. In one version, the program code comprises instructions to operate the gas distributor 132 and gas energizer 188 to expose the substrate 15 to an energized process gas to etch the substrate 15, prior to cleaning the backside surface 20 of the substrate 15.

The gas pressure control instruction sets 228 comprise program code for controlling the pressure in the chamber 102 by regulating the position of the throttle valve 149. For example, the position of the throttle valve 149 is regulated by the extent to which the throttle valve 149 is open or closed.

The temperature control instruction sets 230 may comprise code for controlling the temperature of the substrate support 105 during etching, for example, by the gas filled lamps or the resistive heater in substrate support 105. The temperature control instruction sets 230 may further comprise code for controlling the temperature of the walls of the chamber, such as the temperature of the sidewalls 106 or ceiling 111. In one version, the temperature control instructions 230 maintain the electrostatic chuck at from about 10 to about 100° C. and the chamber wall temperature at from about 20 to about 200° C.

The process monitoring instruction sets 240 may comprise program code to monitor a process in the chamber 102. For example, the process monitoring instruction sets 240 may comprise program code to analyze a signal generated in relation to the detected intensities of wavelengths of radiation reflected from the substrate 15 or energized gas radiation emissions. In one version, the process monitoring instruction sets 240 comprise program code to monitor radiation emissions generated by energized gases in the breakthrough and overetching stages, and to determine the endpoints of these etching stages.

While described as separate instruction sets for performing a set of tasks, it should be understood that each of these instruction sets can be integrated with one another, or the tasks of one set of program code integrated with the tasks of another to perform the desired set of tasks. Thus, the controller 121 and the computer program 206 described herein should not be limited to the specific version of the functional routines described herein; and any other set of routines or merged program code that perform equivalent sets of functions are also in the scope of the present invention. Also, while the controller 121 is illustrated with respect to one version of the chamber, it may compatible for use with other chambers. Further, it should be understood that the apparatus 100 as described above is not limited to an ENABLER chamber or an etch chamber for that matter, as various types of substrate processing chambers may be used.

Figures 6B, 6C, 6D:
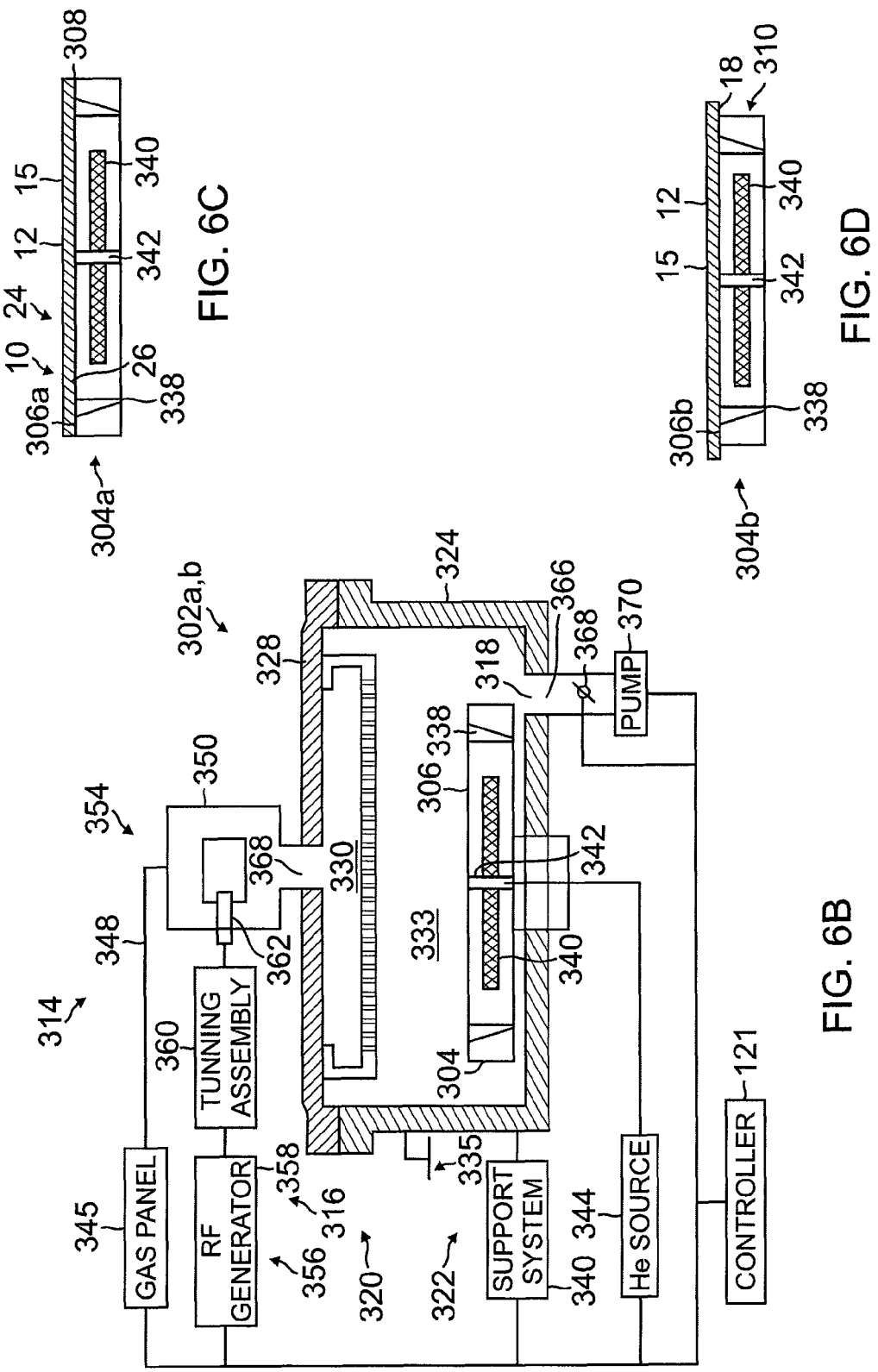
FIG. 6B is a partial sectional side view of an embodiment of a substrate processing chamber of the apparatus shown in FIG. 6A.
FIG. 6C is a partial sectional side view of a substrate support having a substrate resting thereupon.
FIG. 6D is a partial sectional side view of an embodiment of a substrate support having a substrate resting thereupon and extending past the substrate receiving surface of the substrate support.

Another method of cleaning the backside peripheral edge 18 of the substrate 15 may be performed in an apparatus such as, for example but not limited thereto, the apparatus 300 shown in FIG. 6A, which comprises first and second process chambers 302a,b, shown in detail in FIG. 6B, each having a substrate support 304a,b. However, the receiving surface 306b of the substrate support 304b in the second chamber 302b has a diameter less than the diameter of the receiving surface 306a of the substrate support 304a in the first chamber 302a. The first and second process chambers 302a,b may be AXIOM chambers also commercially available from Applied Materials Inc., Santa Clara, Calif.

A substrate 15 comprising a resist layer 10 above a low-k dielectric layer 26 is placed on the receiving surface 306a of the substrate support 304a in the first process chamber 302a by, for example, a substrate transfer mechanism 104 such as a wafer blade. In one version, the substrate 15 comprises a photoresist layer 24, the photoresist layer 24 above a low-k dielectric layer 26. The front surface 12 of the substrate 15 is processed by exposing the substrate 15 to an energized process gas in the first process chamber 302a to etch the resist layer 10 from the substrate 15. In one version, this energized process gas used to etch the front surface 12 of the substrate 15 comprises O2, CO, CO2, H2, N2, NH3, H2O and CF4.

After the etching process, the substrate 15 is transferred from the receiving surface 306a of the substrate support 304a in the first process chamber 302a to the receiving surface 306b of the substrate support 304b in the second process chamber 302b, such that a peripheral edge 18 of the backside surface 20 of the substrate 15 extends beyond the receiving surface 306b of the substrate support 304b in the second process chamber 302b. In one version, the substrate 15 is transferred from the receiving surface 306a of the substrate support 304a in the first process chamber 302a, to the receiving surface 306b of the substrate support 304b in the second process chamber 302b, wherein the receiving surface 306b of the second substrate support 304b has a diameter of from about 200 mm to about 300 mm. The backside surface 20 of the substrate 15 resting on the support 304b in the second process chamber 302b is then exposed to a second energized gas to clean the peripheral edge 18 of the backside surface 20 of the substrate 15 by ashing the etch reside. In one version, the substrate 15 is placed on the receiving surface 306a of the substrate support 304a in the first process chamber 302a to expose a first portion 308 of the peripheral edge 18 of the backside surface 20 of the substrate 15, followed by transferring the substrate 15 to the receiving surface 306b of substrate support 304b in the second process chamber 302b such that a second portion 310 of the peripheral edge 18 of the backside surface 20 of the substrate 15 is exposed where the second portion 310 is larger than the first portion 308 of the peripheral edge 18 of the backside surface 20 of the substrate 15. In one version, the second portion 310 of the peripheral edge 18 of the backside surface 20 of the substrate 15 that is exposed is larger than the first portion 308 by at least about 1 mm. In one version, the energized cleaning gas comprises $H_2$ and $H_2O$. In one version, the backside surface 20 of the substrate 15 is exposed to the second energized process gas for from about 30 to about 60 seconds.

Comparison of FIGS. 5A and 5B, which show the thickness of polymer 10 on the backside surface 20 of a substrate 15 versus the distance of the polymer 10 from the peripheral edge 18 of the substrate 15 immediately after deposition 309, 311 and after sixty seconds 315, 317 of cleaning using oxidizing (FIG. 5A) and reducing chemistry (FIG. 5B), demonstrates the effectiveness of the described cleaning process using a cleaning gas comprising $H_2$ and $H_2O$ to efficiently remove polymer on the backside surface 20 of a substrate 15 while causing minimal damage to the low k material. In FIG. 5A, in a chamber maintained at a pressure of 2 Torr, a gas energizer was used to apply 2500 Watts to 7500 sccm of $O_2$ and 750 sccm of $N_2$. This oxidizing chemistry resulted in approximately 20% of the polymer being removed from the peripheral edge 18 of the backside surface 20 of the substrate 15. In FIG. 5B, in a chamber maintained at a pressure of 3 Torr, a gas energizer was used to apply 2500 Watts to 7500 sccm of $H_2$ and 350 sccm of $H_2O$. This reducing chemistry resulted in approximately 100% of the polymer being removed from the peripheral edge 18 of the backside surface 20 of the substrate 15.

Referring to FIGS. 6A-6D, each process chamber 302a,b of the apparatus 300 comprises a substrate support 304 comprising a receiving surface for a substrate 306, a gas distributor 314 to distribute a process gas within the chamber 302, a gas energizer 316 to energize the process gas and a gas exhaust 318 to exhaust the process gas.

Each process chamber 302 generally is a vacuum vessel, which comprises a first portion 320 and a second portion 322. The first portion 320 comprises a substrate support 304, a sidewall 324 and a gas exhaust 318. The second portion 322 comprises a lid 328 and a gas distributor 314, which defines a gas mixing volume 330 and a reaction volume 333. The lid 328 and sidewall 324 are generally formed from a metal (e.g., aluminum, stainless steel, and the like) and electrically coupled to a ground reference 335.

The substrate support 304 comprises a receiving surface 306 to receive the backside surface 20 of a substrate 15. The second chamber 302b comprises a substrate support 304b having a receiving surface 306b with a diameter less than the diameter of the receiving surface 306a of the substrate support 304a in the first process chamber 302a. The diameter of the receiving surface 306a of the substrate support 304a in the first chamber 302a is generally from about 280 to about 300 mm. In one version, the diameter of the receiving surface 306b of the substrate support 304b in the second chamber 302b is from about 200 to about 300 mm. Given a substrate with a diameter of from about 295 to 300 mm, when the substrate is placed on the receiving surface 306b of the support 304b in the second chamber 302b, there is a considerable amount of overhang by the substrate. In other words, the backside peripheral edge 18 of the substrate is exposed to the process zone 333 within the chamber 302b and is not in contact with the receiving surface 306b of the substrate support 304b. The substrate 15 rests upon the receiving surface 306b of the substrate support 304b so that there is an overhang of the substrate 15 past the receiving surface 306b of the support 304b by at least about 1-2 millimeters and no greater than about 5 mm. In one embodiment, the substrate support 304 may comprise a source of radiant heat, such as gas-filled lamps 338, as well as an embedded resistive heater 340 and a conduit 342. The conduit 342 provides a gas such as helium from a source 344 to the backside of the substrate 15 through grooves (not shown) in the receiving surface 306 of the support 304. The gas facilitates heat exchange between the support 304 and the substrate 15. The temperature of the substrate 15 may be controlled between about 20 and 400 degrees Celsius.

The gas distributor 314 comprises a gas panel 345 which uses a conduit 348 to deliver the process gas to the remote plasma chamber 350. The gas panel 344 (or conduit 348) comprises means, such as mass flow controllers and shut-off valves, to control gas pressure and flow rate for each individual gas supplied to the chamber 350. In the chamber 350, the process gas is ionized and dissociated to form reactive species.

The gas energizer 316 comprises a remote plasma source 354 comprising a power source 356, a gas panel 345, and a remote plasma chamber 350. In one embodiment, the power source 356 comprises a radio-frequency (RF) generator 358, a tuning assembly 360, and an applicator 362. The RF generator 358 is capable of producing of about 200 to 3000 W at a frequency of about 200 to 600 kHz. The applicator 362 is inductively coupled to the remote plasma chamber 350 and energizes a process gas to a plasma in the chamber 350. In this embodiment, the remote plasma chamber 350 has a toroidal geometry that confines the plasma and facilitates efficient generation of radical species, as well as lowers the electron temperature of the plasma. In other embodiments, the remote plasma source 354 may be a microwave plasma source, however, the stripping rates are generally higher using the inductively coupled plasma.

The gas exhaust 318 comprises an exhaust port 366 formed in the sidewall 324 of the process chamber 302, a throttle valve 368 and a pump 370. The gas exhaust 318 is used to maintain a desired gas pressure in the process chamber 302, as well as evacuate the post-processing gases and other volatile compounds from the chamber 302.

A substrate transfer mechanism 104 as previously described is used place the substrate 15 on the receiving surface 306a of the support 304a in the first process chamber 302a, transfer the substrate 15 from the receiving surface 306a of the support 304a in the first process chamber 302a to the receiving surface 306b of the support 304b in the second process chamber 302b as well as remove the substrate 15 from the second process chamber 302b.

The apparatus also comprises a controller 121 as described above. The controller 121 operates the gas distributor 314, gas energizer 316, and gas exhaust 318 in each chamber 302a,b, as well as the substrate transfer mechanism 104. The controller 121 comprises program code that includes instructions to operate the gas distributor, gas energizer, and gas exhaust in the first process chamber 302a to expose the substrate 15 to an energized gas to etch the substrate 15. The controller 121 also comprises program code to operate the substrate transfer mechanism 104 to transfer the substrate 15 from the receiving surface 306a of the substrate support 304a in the first process chamber 302a to the receiving surface 306b of the second substrate support 304b in the second process chamber 302b such that a peripheral edge 18 of a backside surface 20 of the substrate 15 extends beyond the second receiving surface 306b of the second substrate support 304b; and operate the second gas distributor, the second gas energizer, and the second gas exhaust, to expose the substrate 15 to a second energized gas to clean the peripheral edge 18 of the backside surface 20 of the substrate 15. In one version, the program code comprises instructions to operate the gas distributor and gas energizer in the first process chamber to expose the substrate 15 to an energized process gas to etch the substrate 15, prior to cleaning the backside surface 20 of the substrate 15. In one version, the program code comprises instructions to expose the substrate 15 in the second process chamber to an energized gas comprising $H_2$ and $H_2O$. In one version, the program code comprises instructions to expose the substrate 15 in the second process chamber to an energized gas for from about 30 to about 60 seconds.

The present invention has been described with reference to certain preferred versions thereof; however, other versions are possible. For example, various types of substrate processing chambers can be modified for use in either of the substrate processing apparatuses described herein, as would be apparent to one of ordinary skill. Other types of cleaning steps can also be used. Further, alternative steps equivalent to those described for the cleaning process can also be used in accordance with the parameters of the described implementation, as would be apparent to one of ordinary skill. Therefore, the spirit and scope of the appended claims should not be limited to the description of the preferred versions contained herein.

What is claimed is:

1. A method of processing a substrate in a process chamber comprising a substrate support having a receiving surface, the method comprising:
    (a) placing the substrate on the receiving surface of the substrate support in the process chamber;
    (b) exposing a front surface of the substrate to an energized process gas to process the front surface of the substrate; and
    (c) cleaning a peripheral edge of a backside surface of the substrate by:
        (1) raising the substrate above the receiving surface of the substrate support by a distance d which is selected in relation to a pressure of the energized cleaning gas in the process chamber;
        (2) introducing a cleaning gas into the process chamber, the cleaning gas comprising $H_2$ and $H_2O$ and optionally any one or more of $NH_3$, $N_2$, CO and $CO_2$; and
        (3) while maintaining the substrate in the raised position, energizing the cleaning gas with RF energy to expose the backside surface of the substrate to an energized cleaning gas to clean the backside surface.

2. A method according to claim 1 wherein the process chamber comprises a plurality of lift pins capable of extending through conduits in the substrate support, and wherein step (c) comprises raising the substrate by moving the lift pins so that the lift pins extend through the substrate support to contact the backside surface of the substrate to lift up the substrate.

3. A method according to claim 1 wherein (c) comprises raising the substrate above the receiving surface of the substrate support by a distance of from about 1 mm to about 5 mm.

4. A method according to claim 1 wherein (c)(2) comprises introducing a cleaning gas composed of $H_2$ and $H_2O$.

5. A method according to claim 1 wherein (c)(3) comprises exposing the backside surface of the substrate to an energized cleaning gas for from about 30 to about 60 seconds.

6. A method according to claim 1 wherein (b) comprises exposing the front surface of the substrate to an energized process gas comprising HCl, $BCl_3$, HBr, $Br_2$, $Cl_2$, $CCl_4$, $SiCl_4$, $SF_6$, $F_2$, $NF_3$, HF, $CF_4$, $CH_3F$, $CHF_3$, $CHF_3$, $C_2H_2F_2$, $C_2H_4F_6$, $C_2F_6$, $C_3F_8$, $C_4F_8$, $C_2HF_5$, $C_4F_{10}$, $CF_2Cl_2$, $CFCl_3$, $O_2$, $N_2$, He, CO, $C_4F_6$, $C_5F_8$, Ar, Xe, $CH_4$, $H_2$ or $CO_2$ or combinations thereof to etch the front surface of the substrate.

7. A method according to claim 1 comprising energizing the cleaning gas by applying to electrodes or an inductor coil of the process chamber, RF energy at a power level of from about 5000 to about 6000 Watts.

8. A method according to claim 1 wherein (a) comprises selecting a substrate comprising a photoresist layer above a low-k dielectric layer.

9. A method according to claim 8 wherein (b) comprises etching the low-k dielectric layer on the substrate.

10. A method according to claim 8 wherein (c) comprises introducing a cleaning gas composed of $H_2$ and $H_2O$.

11. A method according to claim 10 comprising introducing $H_2$ in a flow rate of from about 50 to about 500 sccm, and $H_2O$ in a flow rate of from about 50 to about 4000 sccm.

12. A method of processing a substrate comprising a photoresist layer above a low-k dielectric layer in a process chamber comprising a substrate support having a receiving surface, the method comprising:
    (a) placing the substrate on the receiving surface of the substrate support in the process chamber; and
    (b) exposing the photoresist layer to an energized process gas to etch the photoresist layer while simultaneously cleaning a peripheral edge of the backside surface of the substrate by:
        (1) raising the substrate above the receiving surface of the substrate support by a distance of from about 1 mm to about 5 mm;
        (2) introducing a cleaning gas into the process chamber, the cleaning gas comprising $H_2$ and $H_2O$ and optionally ny one or more of $NH_3$, $N_2$, CO and $CO_2$; and
        (3) while maintaining the substrate in the raised position, energizing the cleaning gas with RF energy.

13. A method according to claim 12 wherein (c) comprises exposing the backside surface of the substrate to an energized cleaning gas composed of $H_2$ and $H_2O$.

14. A method according to claim 12 comprising energizing the cleaning gas by applying to electrodes or an inductor coil of the process chamber, RF energy at a power level of from about 5000 to about 6000 Watts.

15. A method according to claim 12 wherein (a) comprises etching the low-k dielectric layer on the substrate.

16. A method according to claim 15 wherein (c) comprises introducing a cleaning gas composed of $H_2$ and $H_2O$.

17. A method according to claim 16 comprising introducing $H_2$ in a flow rate of from about 50 to about 500 sccm, and $H_2O$ in a flow rate of from about 50 to about 4000 sccm.

18. A method of processing a substrate in a process chamber comprising a substrate support having a receiving surface, the method comprising:
    (a) selecting a substrate comprising a photoresist layer above a low-k dielectric layer;
    (b) etching the low-k dielectric layer on the substrate;
    (c) placing the substrate on the receiving surface of the substrate support in the process chamber; and
    (d) etching the photoresist layer and cleaning the backside surface of the substrate by:
        (1) raising the substrate above the receiving surface of the substrate support by a distance of from about 1 mm to about 5 mm;
        (2) introducing a cleaning gas in the process chamber, the cleaning gas comprising $H_2$ and $H_2O$ and optionally any one or more of $NH_3$, $N_2$, CO and $CO_2$; and
        (3) energizing the cleaning gas.

19. A method according to claim 18 wherein (d) (2) comprises introducing a cleaning gas composed of $H_2$ and $H_2O$.

20. A method according to claim 18 comprising introducing $H_2$ in a flow rate of from about 50 to about 500 sccm, and $H_2O$ in a flow rate of from about 50 to about 4000 sccm.

21. A method according to claim 18 comprising energizing the cleaning gas by applying to electrodes or an inductor coil of the process chamber, RF energy at a power level of from about 5000 to about 6000 Watts.

22. A method according to claim 18 wherein (d) (3) comprises exposing the backside surface of the substrate to an energized cleaning gas for from about 30 to about 60 seconds.

23. A method according to claim 18 wherein (a) comprises exposing the front surface of the substrate to an energized process gas comprising HCl, $BCl_3$, HBr, $Br_2$, $Cl_2$, $CCl_4$, $SiCl_4$, $SF_6$, $F_2$, $NF_3$, HF, $CF_4$, $CH_3F$, $CHF_3$, $CHF_3$, $C_2H_2F_2$, $C_2H_4F_6$, $C_2F_6$, $C_3F_8$, $C_4F_8$, $C_2HF_5$, $C_4F_{10}$, $CF_2Cl_2$, $CFCl_3$, $O_2$, $N_2$, He, CO, $C_4F_6$, $C_5F_8$, Ar, Xe, $CH_4$, $H_2$ or $CO_2$ or combinations thereof to etch the front surface of the substrate.

24. A method according to claim 18 wherein (b) comprises etching the low-k dielectric layer on the substrate by any of $C_4F_6$, $N_2$, Ar, $CH_2F_2$, $CF_4$, $CHF_3$, $C_4F_8$, $CH_3F$, $O_2$, CO, $H_2$ and mixtures thereof.

* * * * *

UNITED STATES PATENT AND TRADEMARK OFFICE
CERTIFICATE OF CORRECTION

| | | |
|---|---|---|
| PATENT NO. | : 8,083,963 B2 | Page 1 of 1 |
| APPLICATION NO. | : 11/695918 | |
| DATED | : December 27, 2011 | |
| INVENTOR(S) | : Gerardo A. Delgadino et al. | |

It is certified that error appears in the above-identified patent and that said Letters Patent is hereby corrected as shown below:

Col. 14, line 14, Claim 10 should read:
A method according to claim 8 wherein (b) (2) comprises exposing the backside surface of the substrate to an energized cleaning gas composed of $H_2$ and $H_2O$.

Signed and Sealed this
Twenty-sixth Day of June, 2012

David J. Kappos
*Director of the United States Patent and Trademark Office*